(12) United States Patent
Furuhashi et al.

(10) Patent No.: US 6,522,486 B2
(45) Date of Patent: Feb. 18, 2003

(54) OPTICAL COMMUNICATION DEVICE AND METHOD OF FIXING OPTICAL MODULE

(75) Inventors: Chihomi Furuhashi, Tokyo (JP); Takeshi Aikiyo, Tokyo (JP); Yoshikazu Ikegami, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/767,887

(22) Filed: Jan. 24, 2001

(65) Prior Publication Data

US 2001/0038498 A1 Nov. 8, 2001

(30) Foreign Application Priority Data

Jan. 25, 2000 (JP) ..................... 2000-015879
Jan. 11, 2001 (JP) ..................... 2001/003529

(51) Int. Cl.$^7$ .............. G02B 7/02; G02B 6/36
(52) U.S. Cl. ........... 359/819; 359/808; 359/811; 359/820; 385/88; 385/94; 385/91
(58) Field of Search ............ 385/89, 88, 90, 385/91, 98, 99, 45, 52, 33, 49; 257/98, 81, 88, 82, 79, 99; 372/50; 250/310; 359/811–830

(56) References Cited

U.S. PATENT DOCUMENTS

| | | | | |
|---|---|---|---|---|
| 5,675,685 A | * | 10/1997 | Fukuda et al. | 385/89 |
| 6,136,128 A | * | 10/2000 | Chung | 156/235 |
| 6,244,754 B1 | * | 6/2001 | Tagaki et al. | 385/88 |
| 2001/0001622 A1 | * | 5/2001 | Tatoh | 385/94 |

FOREIGN PATENT DOCUMENTS

| JP | 62-139375 | * | 6/1987 |
|---|---|---|---|
| JP | 07-131112 | * | 5/1995 |

* cited by examiner

*Primary Examiner*—Georgia Epps
*Assistant Examiner*—William Choi
(74) *Attorney, Agent, or Firm*—Oblon, Spivak, McClelland, Maier & Neustadt, P.C.

(57) ABSTRACT

An optical communication device which has an optical module including an optical element and a lens system optically coupled through a space and housed in a package, a supporting member for supporting the optical module, and a fixing member directly placed over the optical module for removably fixing the optical module on the supporting member, wherein the optical module is securely sandwiched between the supporting member and the fixing member, and a method of fixing the optical module for use in the optical communication device.

17 Claims, 4 Drawing Sheets

OPTICAL COMMUNICATION DEVICE AND METHOD OF FIXING OPTICAL MODULE

BACKGROUND OF THE INVENTION

1. Field of the Invention

The present invention relates to an optical communication device and a method of fixing an optical module.

2. Description of the Related Art

In a conventional optical communication device, an optical module has an optical element and a lens system housed in a package. The optical module in turn has a mounting base which longitudinally protrudes at four positions in the lower portion of the package in the form of a flange. Screw holes are formed through the mounting base so that the optical module is secured by screwing the mounting base on a supporting member such as a circuit board and a heat sink.

For preventing the transmission loss of light transmitted through an optical fiber as much as possible to achieve a high coupling efficiency, a conventional optical module must be precisely assembled such that the optical axis of its optical element and lens system are in alignment with the optical axis of the optical fiber. However, since the optical module is designed to be screwed on a supporting member such as a circuit board and a heat sink through the mounting base, a stress associated with the screwing directly acts on the package. For this reason, the optical module has a problem in that the bottom plate of the package can be deformed, when it is mounted on the supporting member, causing a shift of the optical axis of the optical element and lens system from the optical axis of the optical fiber, resulting in a possible reduction in the coupling efficiency after it is mounted.

In an optical module which uses a laser diode as an optical element, on the other hand, since the laser diode generates a large amount of heat, a temperature control device such as a Peltier device is used to forcibly cool the optical module, and its package is made in a small thickness to enhance a heat dissipation effect. Thus, such an optical module may be easily deformed due to an externally applied force, heat and so on since the package is thin and accordingly relatively low in strength. Therefore, in the optical module which is so designed that the package is screwed on the heat sink, thermal expansion of the heat sink deforms the bottom plate of the package, causing the optical axis to easily shift as mentioned above.

Particularly, a laser diode having large power on the order of 100 mW or more, for use as an excitation light source for an optical fiber amplifier, is applied with an injection current close to its limit of performance in order to provide high output. Thus, with an optical module which uses such a laser diode, even the slightest shift of the optical axis results in significant reduction in the coupling efficiency, so that it is necessary to avoid reduced power caused by the optical system to the utmost. Moreover, an optical fiber amplifier which uses such an optical module has the problem that it cannot achieve expected output characteristics if the coupling efficiency is reduced.

SUMMARY OF THE INVENTION

It is an object of the present invention to provide an optical communication device and a method of fixing an optical module which are capable of avoiding an unwanted stress acting on the optical module during the mounting to prevent a reduction in the coupling efficiency caused by a shift of the optical axis of an optical element and a lens system from the optical axis of an optical fiber.

To achieve the above object, an optical communication device according to the present invention has an optical module which has an optical element and a lens system optically coupled together through a space and housed in a package, and a supporting member for supporting the optical module, wherein a fixing member is directly placed over the optical module for removably fixing the optical module to the supporting member, so that the optical module is securely sandwiched between the fixing member and the supporting member.

Also, to achieve the above object, in a method of fixing an optical module on a supporting member according to the present invention, wherein the optical module has an optical element and a lens system optically coupled through a space and housed in a package. The method comprises the step of removably fixing the optical module on the supporting member by a fixing member directly placed over the optical module such that the optical module is sandwiched between the supporting member and the fixing member.

As the optical module is placed between the supporting member and the fixing member and removably sandwiched securely between the fixing member and the supporting member, a stress associated with the fixation, when the optical module is mounted, acts on the optical module through the fixing member, and the optical module is additionally pressed by the fixing member onto and in planar contact with the supporting member, thereby preventing the optical axis from shifting. This optical module is used as an excitation light source, and optically connected to an excitation optical fiber doped with a rare earth element, thereby allowing the optical communication device (optical fiber amplifier) to achieve expected power characteristics.

According to a preferred embodiment of the present invention, it is possible to provide an optical communication device, and a method of fixing an optical module which avoid an unwanted stress acting on the optical module when the optical module is mounted, and can prevent a reduction in a coupling efficiency resulting from a shift of the optical axis of an optical element and a lens system from the optical axis of the optical fiber.

The above and other objects, features and advantages of the present invention will become more apparent from the following detailed description with reference to the accompanying drawings.

DETAILED DESCRIPTION OF THE PREFERRED EMBODIMENTS

Figure 1:
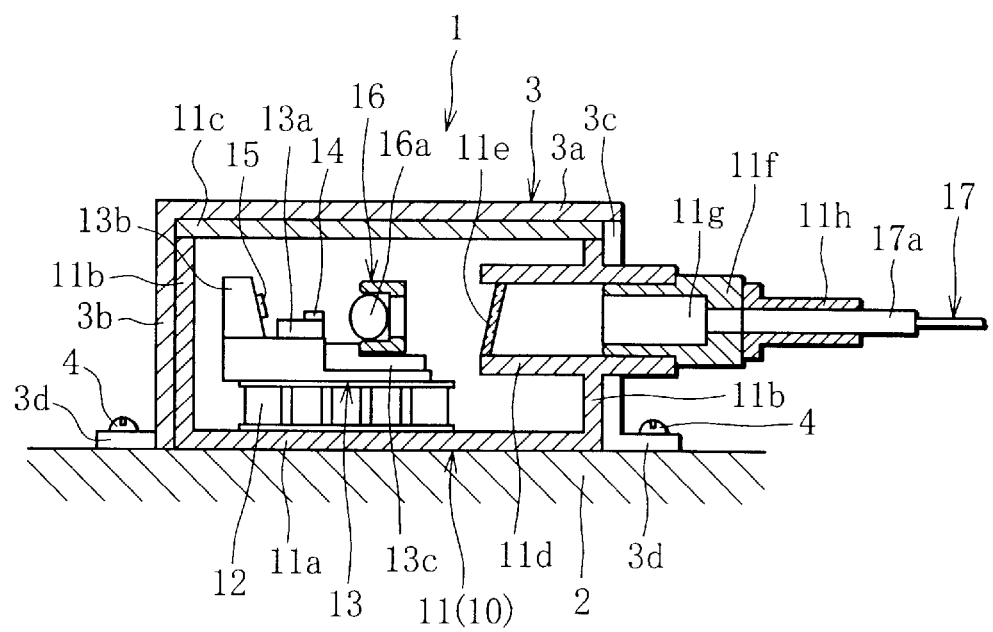
FIG. 1 is a front cross-sectional view illustrating an optical communication device according to one embodiment of the present invention.

An optical communication device and a method of fixing an optical module according to embodiments of the present invention will hereinafter be described in detail with reference to the accompanying drawings, FIGS. 1 to 8. FIG. 1 illustrates an optical communication device 1 comprising an optical module which functions as an excitation light source (for example, a 1480 nm wavelength band laser diode), for example, an optical fiber amplifier and its components associated with the optical module.

The optical communication device 1 has an optical module body 10 fixed on a supporting member 2 by a fixing member 3, as illustrated in FIG. 1.

Figure 2:
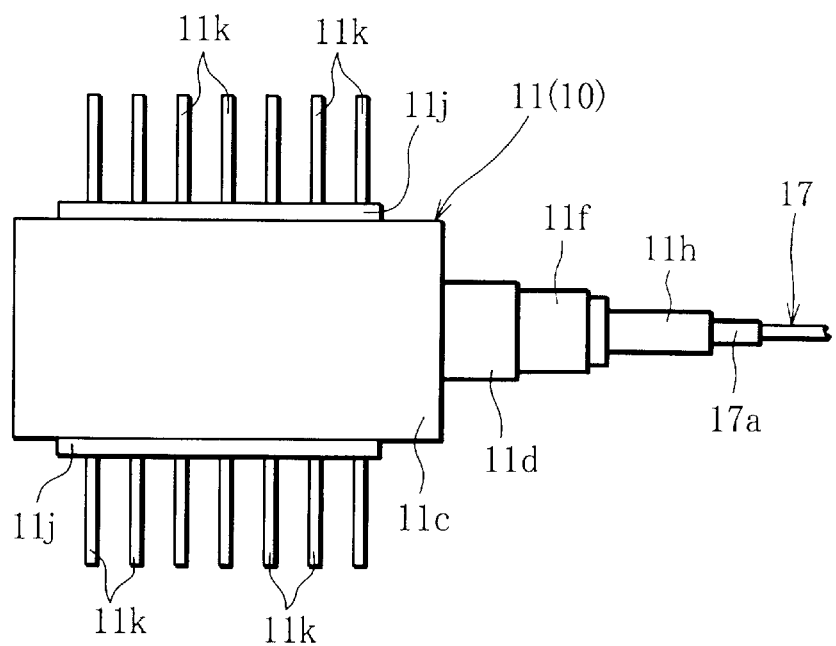
FIG. 2 is a plan view of an optical module used in the optical communication device of FIG. 1.

The optical module body 10 comprises a package 11, a Peltier device 12, a base 13, a laser diode 14, a photodiode 15, and a first lens holder 16, as illustrated in FIGS. 1 and 2. The Peltier device 12, the base 13, the laser diode 14, the photodiode 15 and the first lens holder 16 are housed in the package 11.

As illustrated in FIG. 1, the package 11 has a bottom plate 11a, peripheral walls 11b, and a cover 11c which is mounted over the peripheral walls 11b. The package 11 is also provided with a mounting cylinder 11d extending from the peripheral wall 11b in both inward and outward directions; a glass window 11e obliquely fitted in the mounting cylinder lid; and a second lens holder 11f extending outward from the mounting cylinder 11d. The second lens holder 11f has a second lens 11g disposed therein, and a fiber sleeve 11h at the outer end thereof. A ferrule 17a attached to the end of an optical fiber 17 is fixed to the fiber sleeve 11h. Further, as illustrated in FIG. 2, the package 11 has a plurality of lead pins 11k extending from wiring boards 11j made of ceramic, which are disposed on the peripheral walls 11b on both sides in the width direction. The respective lead pins 11k are connected to the laser diode, the photodiode, the Peltier device, and so on associated therewith within the package 11.

The Peltier device 12 is a temperature control device disposed on the bottom plate 11a as illustrated in FIG. 1 for cooling heat generated from the operating laser diode 14 to control the temperature of the laser diode 14 at a predetermined temperature. The base 13 is carried on the Peltier device 12. The Peltier device 12 adjusts a current value based on a temperature measured by a thermistor (not shown) disposed near the laser diode 14 to control the temperature of the laser diode 14.

As illustrated in FIG. 1, the base 13 has the laser diode 14 mounted thereon through a first carrier 13a, and the photodiode 15 mounted thereon through a second carrier 13b. The laser diode 14 is positioned opposite to the photodiode 15. The base 13 also has the first lens holder 16 mounted thereon through a mounting member 13c.

The laser diode 14, which is optically coupled to a first lens 16a, a second lens 11g and the optical fiber 17, later described, through the space, emits laser light at a predetermined wavelength from the front end face thereof toward the first lens 16a as well as emits a monitor light from the rear end face thereof toward the photodiode 15. For this purpose, the laser diode 14 is positioned precisely with respect to the first lens 16a such that a shift of its active layer with the optical axis of the first lens 16a in the height direction falls within several μm. It goes without saying that the second lens 11g is similarly positioned precisely with respect to the core (not shown) of the optical fiber 17 exposed on the end face of the ferrule 17a.

The photodiode 15 monitors the power of the monitor light emitted from the rear end face of the laser diode 14.

The first lens holder 16, which is made of a metal such as stainless steel and steel, has a first lens 16a fixed therein, for example, with a low melting point glass for collimating the light emitted from the laser diode 14.

Thus, in the optical module 10, the laser diode 14, the first lens 16a, the second lens 11g and the optical fiber 17 are optically coupled through the space between these components.

The supporting member 2, in turn, functions as a heat sink for absorbing heat from the optical module 10, particularly, the bottom plate 11a of the package 11 for cooling the optical module 10, in this embodiment. Alternatively, however, it goes without saying that the supporting member 2 may be a circuit board, provided that it can be used to fix the optical module 10 thereon with the fixing member 3.

Figure 3:
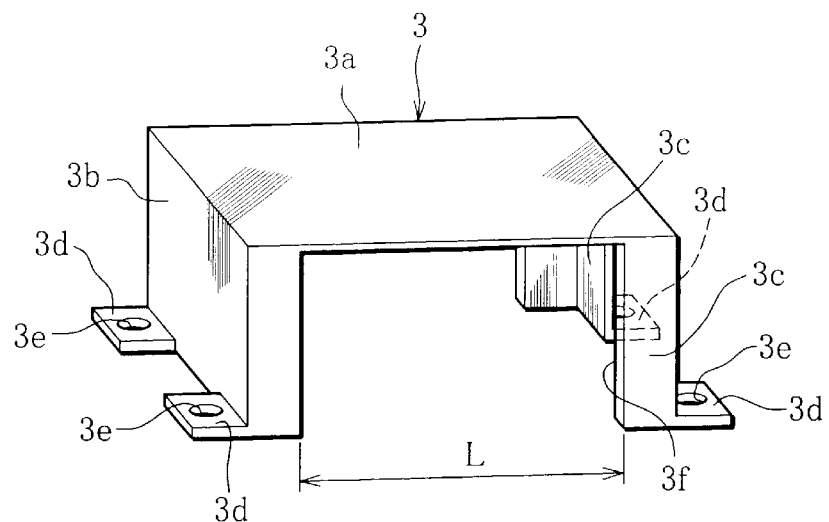
FIG. 3 is a perspective view illustrating a fixing member used in the optical communication device of FIG. 1.

The fixing member 3, which is a member for removably fixing the optical module 10 between the fixing member 3 and the supporting member 2, is preferably made of a metal having a coefficient of thermal conductivity of 200 (W·m$^{-1}$·K$^{-1}$) or more, such as copper (coefficient of thermal conductivity: 398 W·m$^{-1}$·K$^{-1}$ at 20° C.) and aluminum (coefficient of thermal conductivity: 237 W·m$^{-1}$·K$^{-1}$ at 20° C.), or an easily moldable synthetic resin such as polyvinyl chloride (PVC) and polyethylene terephthalate (PET). As illustrated in FIG. 3, the fixing member 3 is formed with a wall 3b on one side of the top plate 3a and with two legs 3c disposed to step over the mounting cylinder 11d on the other side of the top plate 3a in the longitudinal direction, respectively. The fixing member 3 is formed with mounting lugs 3d extending outward in the longitudinal direction in lower portions of the wall 3b and the two legs 3c.

Each of the mounting lugs 3d is formed with a screw hole 3e. In the fixing member 3 constructed as described above, since the mounting cylinder 11d of the optical module 10 is disposed between the two legs 3c, the spacing between the two legs 3c is set larger than the diameter of the mounting cylinder 11d, and a spacing L of a side opening 3f formed between the wall 3b and the leg 3c, shown in FIG. 3, is set larger than the length of the wiring board 11j of the optical module 10 along the longitudinal direction such that the side opening 3f does not interfere with the plurality of lead pins 11k to cause an undesirable load.

The optical communication device 1 configured as described above is assembled in the following manner.

Figure 4A:
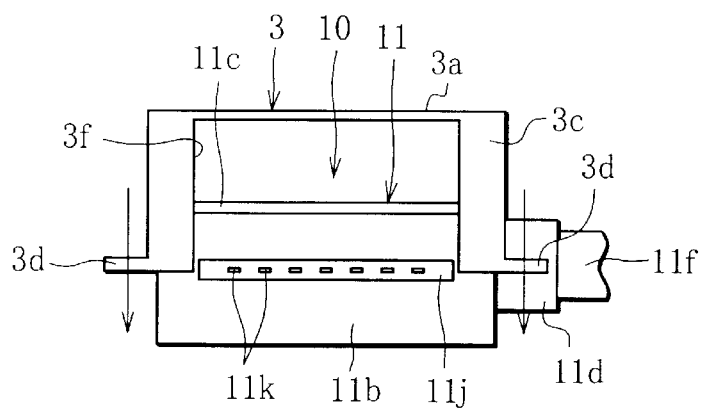
FIG. 4A is a front view illustrating the optical module of FIG. 2 fixed on a heat sink by the fixing member.
Figure 4B:
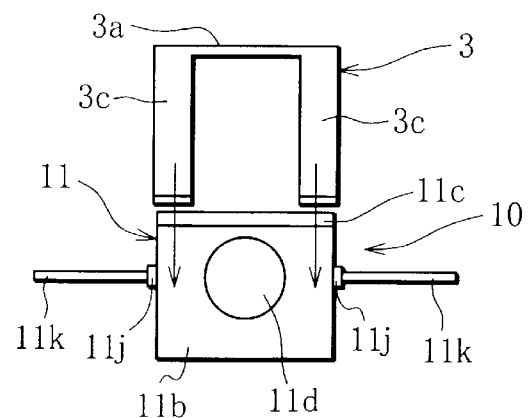
FIG. 4B is a right side view of the optical module in FIG. 4A.

First, the optical module 10 is placed at a proper position on the supporting member 2, and the fixing member 3 is placed over the optical module 10 from above, as illustrated in FIGS. 4A and 4B.

Figure 5:
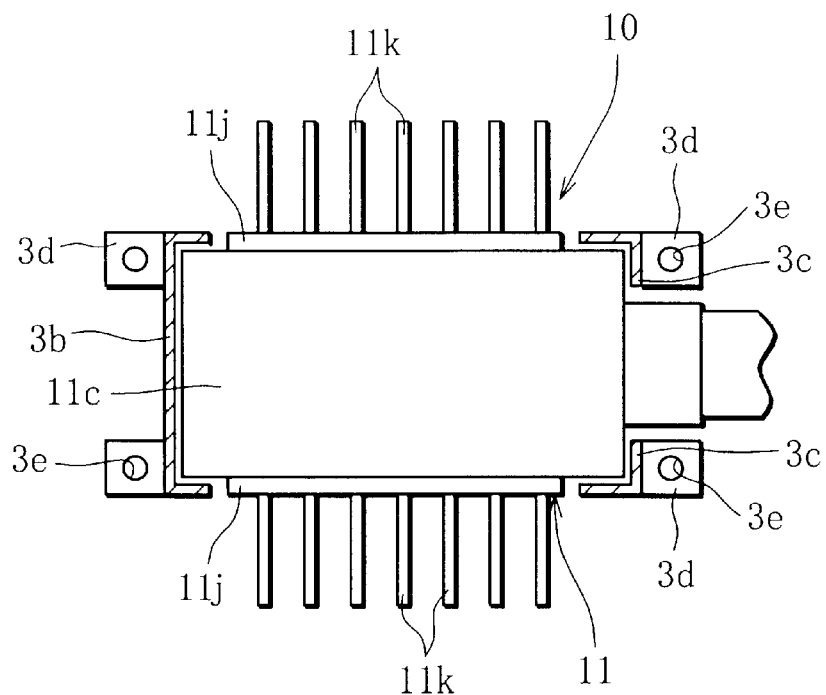
FIG. 5 is a plan view illustrating the optical module fixed on the heat sink by the fixing member with a top plate removed therefrom.

Next, the fixing member 3 is removably fixed on the supporting member 2 with screws 4 (see FIG. 1) at the respective mounting lugs 3d, making use of the screw holes 3e of the respective mounting lugs 3d to assemble the optical communication device 1. As a result, the optical module 10 is securely sandwiched between the supporting member 2 and the fixing member 3 and hence fixed on the supporting member 2, as illustrated in FIGS. 1 and 5.

In this event, since the optical module 10 of the optical communication device 1 is removably fixed on the supporting member 2 through the fixing member 3, a stress associated with the screwing will never act directly on the package 11. For this reason, the optical communication device 1 is less susceptible to deformation of the bottom plate 11a of the package 11 during the assembly, and to the shift of the optical axis of the laser diode 14, the first lens 16a and the second lens 11g housed therein from the optical axis of the optical fiber 17, thereby making it possible to prevent a reduction in the coupling efficiency of the product.

Moreover, the optical communication device 1 has the top surface of the optical module 10, i.e., the top surface of the package 11 pressed by the fixing member 3 in planar contact therewith. Therefore, in the optical communication device 1, even if the supporting member 2 functioning as a heat sink thermally expands, the top surface of the package 11 is pressed by the top plate 3a of the fixing member 3, and also since the fixing member 3 has a coefficient of thermal conductivity of 200 ($W \cdot m^{-1} \cdot K^{-1}$) or more and thus dissipates heat of the supporting member 2, deformation of the bottom plate 11a can be prevented. Therefore, the optical communication device 1 is also prevented from a shift of the optical axis caused by the thermal influence. In addition, since the optical communication device 1 has the supporting member 2 and the bottom plate 11a maintained in close contact with each other, the heat generated by the laser diode 14 can be efficiently dissipated to the supporting member 2.

Further, the fixing member 3 is placed over the optical module 10, and removably fixed to the supporting member 2 at the respective mounting lugs 3d. Thus, the fixing member 3 is removable together with the optical module 10, so that if the mounting lugs 3d are deteriorated due to changes with the lapse of time, or if any of the mounting lugs 3d is distorted due to a failure such as excessively strong screwing for mounting the fixing member 3 to the supporting member 2, the above-mentioned characteristics of the communication device 1 can be maintained only by replacing the previous fixing member 3 with a new one. Furthermore, since the fixing member 3 is made of a material such as a synthetic resin or a metal, it can be manufactured at a low cost by a resin molding process or a press working.

Figure 6:
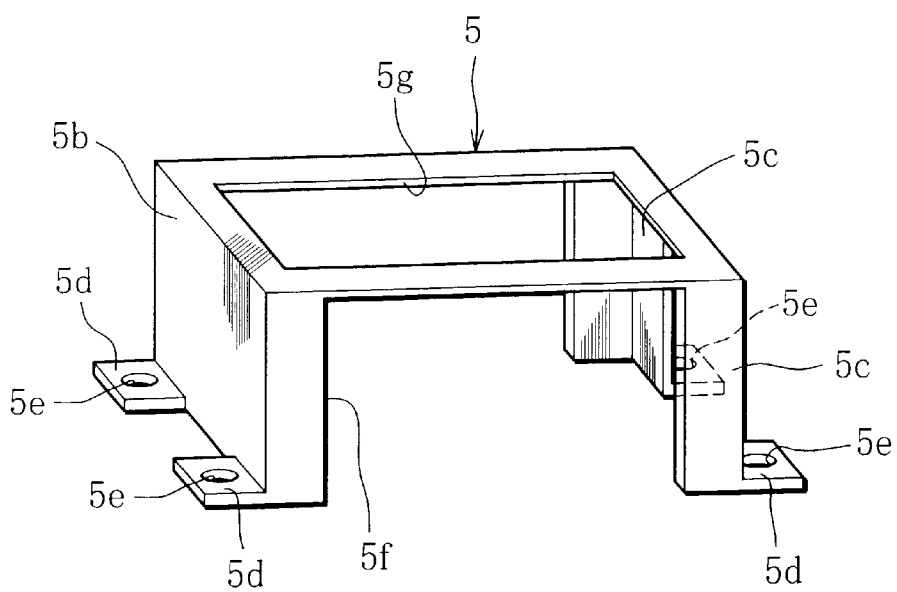
FIG. 6 is a perspective view illustrating an exemplary modification to the fixing member.

Here, the fixing member may be constructed similarly to the fixing member 3 with an additional opening 5g formed through the top plate 5a as a fixing member 5 as illustrated in FIG. 6, provided that the optical module can be disposed between the supporting member and the fixing member such that the optical module is securely sandwiched between the two members in a removable manner. In FIG. 6, constituent parts of the fixing member 5 identical to those of the fixing member 3 are designated the same reference numerals, and detailed description thereon is herein omitted.

When the fixing member 5 as described above is used, the optical communication device 1 can benefit from an improved heat dissipation property of the package 11 resulting .from the open top of the package 11, in addition to the foregoing effects provided by the fixing member 3. Moreover, the package 11 having the open top advantageously allows the user to readily view a label adhered on the top surface of the optical module 10, on which characteristic values, a serial number and so on may be written.

Also, the foregoing embodiment has been described for the optical communication device 1 which has the optical module 10 using the laser diode 14 as an optical element for emitting light which is incident into the optical fiber 17. The optical communication device 1 of the present invention, however, may be any type of device as long as it comprises an optical module which contains an optical element and a lens system coupled through the space, for example, a photo-receiver. An optical module for use in such a photo-receiver may be a light receiving module which has, for example, a photodiode fixed in the package 11 as an optical element, and optically coupled to the optical fiber 17 through the space.

Also, the optical module for use in the optical communication device 1 and the method of fixing an optical module according to the present invention may be a light combining/splitting module, one type of optical module which has, for example, a wavelength filter, a polarizing beam splitter or the like, as an optical element, fixed in the package 11, and optically coupled to the optical fiber 17 through the space, for combining/splitting light introduced or emitted via the optical fiber through these components by known principles.

Further, the optical module for use in the optical communication device 1 and the method of fixing an optical module according to the present invention may have a laser diode for exciting an erbium-doped fiber, a wavelength filter, an isolator, a beam splitter, and a photodiode mounted in the package as an optical element, as disclosed in Japanese Unexamined Patent Publication No. Hei 10-223962.

This optical module functions as a composite optical module for optical fiber amplification which has the foregoing components optically coupled together through the space such that signal light incident from the optical fiber and light emitted from the excitation laser diode are combined by the wavelength filter, and the combined light passes through the isolator, and again split by the beam splitter to make the split light beams incident on the photodiode and the optical fiber, respectively.

As described above, the optical communication device and the method of fixing an optical module according to the present invention are suitable as an optical communication device and a method of fixing an optical module, which are adapted to fix the optical module with the bottom plate of its package in close contact with a supporting member, wherein the optical module has an optical element and a lens system fixed together through the space within the package, and optically coupled to provide a predetermined function.

Also, the foregoing embodiment has been described for the optical communication device 1 which employs the optical module 10 that uses the laser diode 14 as an optical element such that light emitted therefrom is incident on the optical fiber 17 through a separate lens.

Figure 7:
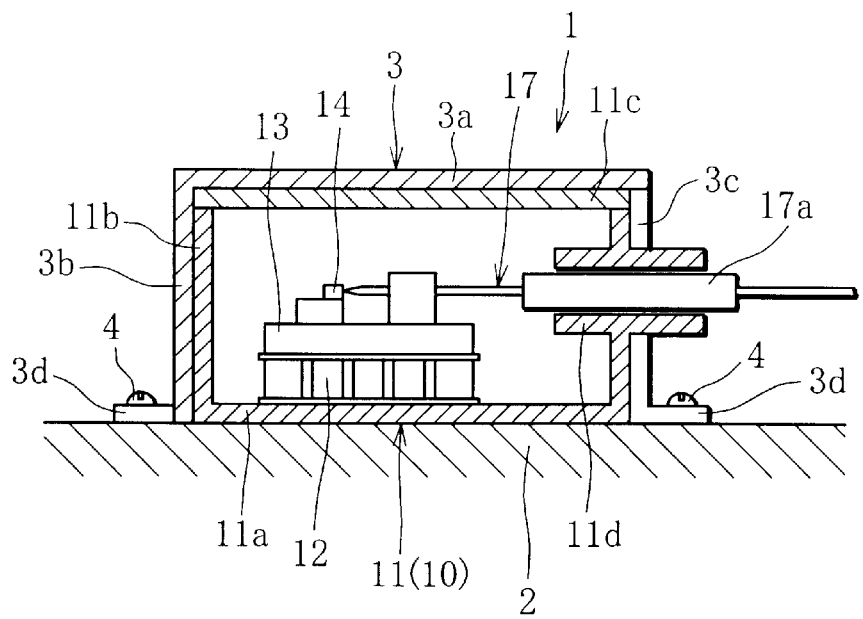
FIG. 7 is a front cross-sectional view illustrating an optical communication device according to another embodiment of the present invention.

Alternatively, an optical module for use in the optical communication device 1 of the present invention ay be an optical module 10 as illustrated in FIG. 7. Specifically, a Peltier device 12 and a laser diode 14 as an optical element are mounted in a package 11, and an optical fiber 17 is penetrated into the interior of the package 11 through the side wall of the package 11. Then, the distal end of the optical fiber 17 facing the laser diode 14 is formed into a lens shape (in other words, the optical fiber 17 is used as a lens system). Also, the laser diode 14 is optically coupled to the optical fiber 17 through the space near the laser diode 14, and the optical module 10 is securely sandwiched between a fixing member 3 and a supporting member 2.

The optical module 10 configured as illustrated in FIG. 7 experiences a reduction in the coupling efficiency over 10% if a position in a direction perpendicular to the optical axis of the optical fiber 17 shifts, for example, by 0.3 $\mu$m. As such, a high accuracy is required for the positioning of the optical module 10, so that the fixing method of the present invention, which can prevent the optical axis from shifting due to deformation of the bottom plate 11a of the package 11, can be suitably applied to the optical module 10.

In the optical module 10 illustrated in FIG. 7, constituent parts corresponding to those of the optical module 10 illustrated in FIG. 1 are designated the same reference numerals, and detailed description thereon is herein omitted.

Figure 8:
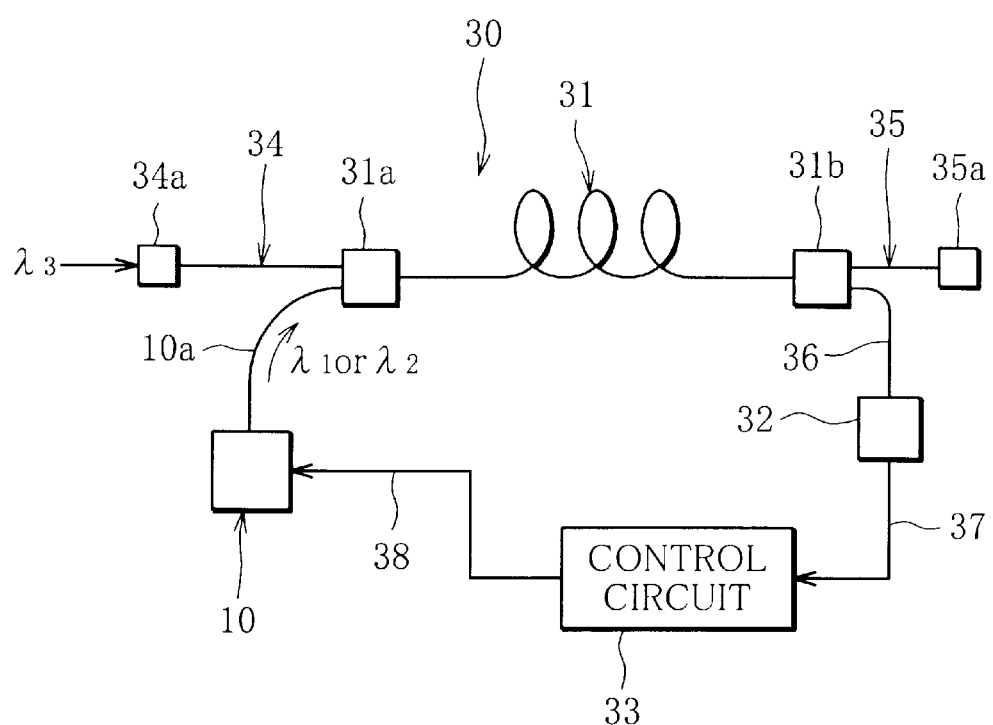
FIG. 8 is a block diagram generally illustrating the configuration of an optical fiber amplifier which is an example of the optical communication device of the present invention.

On the other hand, an optical fiber amplifier, which is an example of the optical communication device according to the present invention, employs the optical module 10 as an excitation light source, and is assembled in the following manner with an excitation optical fiber doped with a rare earth element, for example, an erbium doped fiber (hereinafter called the "EDF") 31 optically connected therewith, as illustrated in FIG. 8.

Specifically, an optical fiber amplifier 30 comprises the optical module 10, the EDF 31, a photodiode 32 for monitoring, and a control circuit 33, as illustrated in FIG. 8.

The EDF 31 has a first optical coupler 31a at one end and a second optical coupler 31b at the other end, and an optical fiber 34 having an input terminal 34a and the optical module 10 having an optical fiber 10a are respectively connected to the first optical coupler 31a. Also, an optical fiber 35 having an output terminal 35a and an optical fiber 36 connected to a photodiode 32 are respectively connected to the second optical coupler 31b.

The photodiode 32 monitors the intensity of light output from the second optical coupler 31b.

The control circuit 33 is connected to the photodiode 32 through an electric signal line 37 and to the optical module 10 through an electric signal line 38, respectively, and controls the operation of the optical module 10, which functions as an excitation light source, based on an output signal of the photodiode 32 transmitted thereto through the electric signal line 37.

Thus, in the optical fiber amplifier 30, as the EDF 31 is applied with excitation light at wavelength $\lambda 1$ (=approximately 980 nm) or at wavelength $\lambda 2$ (=approximately 1480 nm) from the optical module 10 through the first optical coupler 31a, the EDF 31 is brought into an excitation state. At this time, as a signal light at wavelength $\lambda 3$ (=approximately 1550 nm) is incident from the input terminal 34a to the optical fiber 34, the signal light is amplified by the EDF 31 and then output from the output terminal 35a.

Then, a portion of the amplified signal light is branched by the second optical coupler 31b, and guided to the photodiode 32 through the optical fiber 36 for monitoring. The control circuit 33 adjusts the amount of current supplied to the optical module 10 in accordance with the amount of light monitored by the photodiode 32, to control the amount of excitation light input to the EDF 31.

In the optical fiber amplifier 30, since the EDF 31 properly controls the amount of amplification to signal light in the foregoing manner, the optical fiber amplifier 30 requires the optical module 10, which prevents a reduction in the coupling efficiency resulting from a shift of the optical axis, as an essential component, and can achieve expected power characteristics.

Here, the excitation optical fiber doped with a rare earth element for use in the optical fiber element may be, in addition to the EDF, EDF co-doped with aluminum (Al), a so-called hybrid type EDF which is a combination of two types of EDFs having different glass compositions such as EDF co-doped with Al and EDF co-doped with Al/P, quartz-based EDF and glass fluoride EDF, and so on, tellurite glass EDF which is based on tellurite glass to significantly extend an amplification band, and so on.

What is claimed is:

1. An optical communication device having an optical module which has an optical element and a lens system optically coupled together through a space and housed in a package, and a supporting member for supporting the optical module, said optical communication device comprising:

a fixing member adapted to be directly and separably placed over said optical module for removably fixing said optical module to said supporting member, said optical module securely sandwiched between and in direct contact with said fixing member and supporting member.

2. The optical communication device according to claim 1, wherein said fixing member has a coefficient of thermal conductivity of 200 $(W \cdot m^{-1} \cdot K^{-1})$ or more.

3. The optical communication device according to claim 1, wherein said fixing member has a top plate formed with an opening.

4. The optical communication device according to claim 2, wherein said fixing member has a top plate formed with an opening.

5. The optical communication device according to claim 1, wherein said fixing member is formed with an opening through a side wall thereof.

6. The optical communication device according to claim 2, wherein said fixing member is formed with an opening through a side wall thereof.

7. The optical communication device according to claim 3, wherein said fixing member is formed with an opening through a side wall thereof.

8. The optical communication device according to claim 4, wherein said fixing member is formed with an opening through a side wall thereof.

9. The optical communication device according to claim 1, further comprising:

a laser diode as said optical element, said laser diode functioning as an excitation light source; and an excitation optical fiber brought into an excitation state by excitation light emitted from said laser diode, wherein an optical signal is amplified by passing said optical signal through said excitation optical fiber which is in an excitation state by the excitation light emitted from said laser diode.

10. The optical communication device according to claim 2, further comprising:

a laser diode as said optical element, said laser diode functioning as an excitation light source; and an excitation optical fiber brought into an excitation state by excitation light emitted from said laser diode, wherein an optical signal is amplified by passing said optical signal through said excitation optical fiber which is in an excitation state by the excitation light emitted from said laser diode.

11. The optical communication device according to claim 3, further comprising:

a laser diode as said optical element, said laser diode functioning as an excitation light source; and an excitation optical fiber brought into an excitation state by excitation light emitted from said laser diode, wherein an optical signal is amplified by passing said optical signal through said excitation optical fiber which is in an excitation state by the excitation light emitted from said laser diode.

12. The optical communication device according to claim 5, further comprising:
- a laser diode as said optical element, said laser diode functioning as an excitation light source; and
- an excitation optical fiber brought into a pumped state by excitation light emitted from said laser diode,
- wherein an optical signal is amplified by passing said optical signal through said excitation optical fiber which is in an excitation state by the excitation light emitted from said laser diode.

13. The optical communication device according to claim 1, wherein said lens system includes an optical fiber having a distal end formed in a lens shape, said distal end facing a laser diode.

14. The optical communication device according to claim 2, wherein said lens system includes an optical fiber having a distal end formed in a lens shape, said distal end facing a laser diode.

15. The optical communication device according to claim 3, wherein said lens system includes an optical fiber having a distal end formed in a lens shape, said distal end facing a laser diode.

16. The optical communication device according to claim 5, wherein said lens system includes an optical fiber having a distal end formed in a lens shape, said distal end facing a laser diode.

17. A method of fixing an optical module on a supporting member, said optical module having an optical element and a lens system optically coupled together through a space and housed in a package, said method comprising the step of:
- removably fixing said optical module on said supporting member by a fixing member directly and separably placed over said optical module such that said optical module is sandwiched between and in direct contact with said supporting member and said fixing member.

* * * * *